United States Patent
Kamannavar et al.

(10) Patent No.: US 7,447,966 B2
(45) Date of Patent: Nov. 4, 2008

(54) HARDWARE VERIFICATION SCRIPTING

(75) Inventors: Anand V. Kamannavar, Cincinnati, OH (US); Nathan Dirk Zelle, Dallas, TX (US); Bradley Forrest Bass, Carrollton, TX (US); Sahir Shiraz Hoda, Plano, TX (US); Erich Matthew Gens, Allen, TX (US)

(73) Assignee: Hewlett-Packard Development Company, Houston, TX (US)

( * ) Notice: Subject to any disclaimer, the term of this patent is extended or adjusted under 35 U.S.C. 154(b) by 724 days.

(21) Appl. No.: 11/030,349

(22) Filed: Jan. 5, 2005

(65) Prior Publication Data

US 2006/0150126 A1 Jul. 6, 2006

(51) Int. Cl.
*G06F 11/00* (2006.01)
(52) U.S. Cl. .................. 714/741; 714/739; 714/724; 714/736; 714/742; 714/824; 714/25; 714/32; 714/715; 703/14; 703/15; 702/119; 716/1; 716/4; 716/5
(58) Field of Classification Search ................... None
See application file for complete search history.

(56) References Cited

U.S. PATENT DOCUMENTS

| | | | |
|---|---|---|---|
| 5,381,417 A | 1/1995 | Loopik et al. | |
| 5,574,855 A * | 11/1996 | Rosich et al. | 714/41 |
| 5,920,830 A | 7/1999 | Hatfield et al. | |
| 5,923,867 A * | 7/1999 | Hand | 703/14 |
| 5,995,915 A | 11/1999 | Reed et al. | |
| 6,081,864 A * | 6/2000 | Lowe et al. | 710/100 |
| 6,170,078 B1 * | 1/2001 | Erle et al. | 716/4 |
| 6,530,054 B2 * | 3/2003 | Hollander | 714/739 |
| 6,560,720 B1 * | 5/2003 | Chirashnya et al. | 714/32 |
| 6,721,922 B1 | 4/2004 | Walters et al. | |
| 7,117,411 B2 * | 10/2006 | McNeely et al. | 714/724 |
| 7,185,232 B1 * | 2/2007 | Leavy et al. | 714/41 |
| 2003/0217345 A1 | 11/2003 | Rajsuman et al. | |

FOREIGN PATENT DOCUMENTS

GB  2406400  3/2005
WO  WO 03/085706  10/2003

OTHER PUBLICATIONS

Michael Orr et al., Script/Simulation Approach Speeds SoC Verification, EE Times, Feb. 5, 2002.

* cited by examiner

*Primary Examiner*—John P Trimmings

(57) ABSTRACT

Exemplary techniques for verifying a hardware design are described. In a described embodiment, a method comprises compiling an error verification object corresponding to an error verification command to verify a portion of a hardware design of a device under test. The error verification object is compiled in accordance with data provided by an error scripting module. The error scripting module has access to hardware-specific data corresponding to the hardware design of the device under test. The compiled object is sent to the device under test and a response to the compiled object is received from the device under test. The received response from the device under test is parsed in accordance with data provided by the error scripting module.

34 Claims, 4 Drawing Sheets

HARDWARE VERIFICATION SCRIPTING

TECHNICAL FIELD

The present description generally relates to hardware verification. More particularly, an embodiment relates to verifying hardware designs through scripting.

BACKGROUND

As integrated circuit (IC) fabrication technology improves, manufacturers are able to integrate additional functionality onto a single chip. The additional functionality in turn increases the complexity of the designs. Also, the increase in the complexity lengthens the design process.

A typical design process for ICs includes a front-end design phase and a back-end development phase. During the front-end phase, hardware engineers design and develop a logical representation of an IC from a set of specifications in the form of a schematic. The schematic is then loaded into a computer from which a circuit netlist is generated. The netlist defines the entire IC design including all components and interconnections.

The IC information may be developed using a hardware description language (HDL) and synthesis. With the aid of circuit simulation tools available on computers, a designer can then simulate the functionality of a given circuit. The circuit simulation process may involve several iterations of design modifications and improvements until the circuit design is finalized.

The back-end development involves several steps during which a final circuit layout (physical description) is developed based on the schematic design of the front-end phase. Various building blocks (or cells), as defined by the finalized circuit schematic, are placed within a predefined floor plan. The cells are then interconnected during a routing stage. After routing, the accuracy of the layout is verified against the schematic, and if no errors or design rule violations are found, the circuit layout information is used for the process of fabrication. The fabricated IC may be further verified to check for fabrication errors.

The use of computers substantially speeds up the verification process. However, verification of complex designs can still add substantial delay to finalizing a design. For example, a team of software designers who write, compile, and debug the software code for the verification tool has to closely cooperate with a team of hardware designers who design the actual hardware.

Coordinating these teams from both a technical perspective (i.e., merging software expertise with hardware expertise) and a timing perspective can be a challenging task when verifying a complex design. In particular, for each change to the verification tool, members from both teams would have to be consulted and coordinated. This problem is further amplified due to the existence of a multitude of tools that are utilized in design and verification of an IC.

SUMMARY

In a described embodiment, a method comprises compiling an error verification object corresponding to an error verification command to verify a portion of a hardware design of a device under test. The error verification object is compiled in accordance with data provided by an error scripting module. The error scripting module has access to hardware-specific data corresponding to the hardware design of the device under test. The compiled object is sent to the device under test and a response to the compiled object is received from the device under test. The received response from the device under test is parsed in accordance with data provided by the error scripting module.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

Exemplary techniques for verifying a hardware design are described. The techniques enable a user (such as a hardware engineer) to design and run hardware verification tests without intricate knowledge of the software aspects of the verification tool (e.g., multiple test source files, programming language intricacies, debugging, and the like). The user may perform the verification through customary software tools. The software tools may in turn utilize an error scripting language (ESL) to communicate with a device under test (DUT), e.g., through an ESL module. In one embodiment, the ESL module limits the need for recompiling the entire verification toolset when changes are made to a test. The ESL may be portable to different design verification environments. Also, there may be no reference to specific software tools within the ESL syntax.

Verification System Overview

Figure 1:
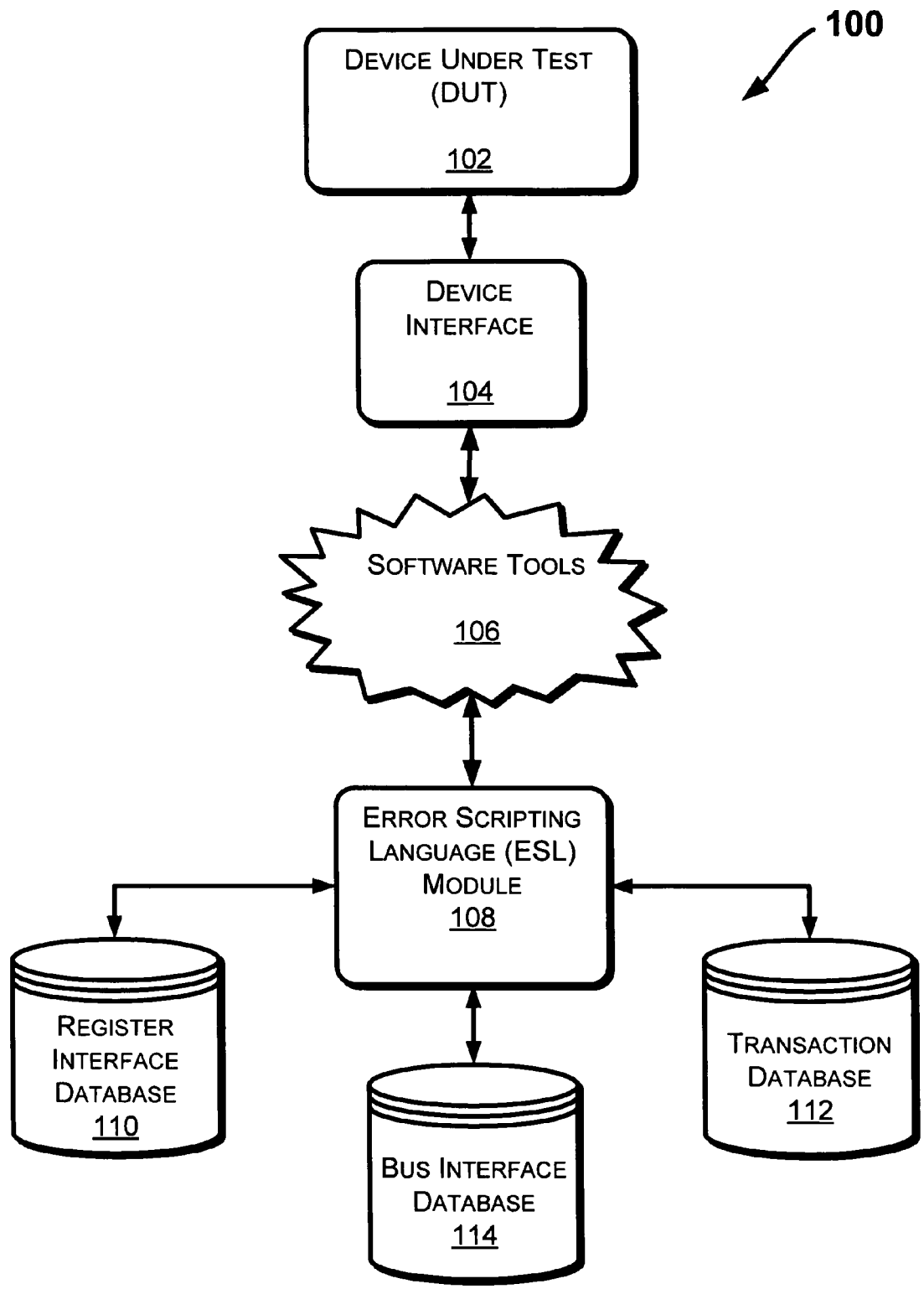
FIG. 1 illustrates an exemplary verification system which utilizes an error scripting language (ESL) module to verify a hardware design, according to an embodiment.

FIG. 1 illustrates an exemplary verification system 100 which utilizes an error scripting language (ESL) module to verify a hardware design. In one embodiment, the direction of arrows shown in FIG. 1 indicates the direction of data flow between the modules of the system 100. The verification system 100 includes a device under test (DUT) 102. The DUT 102 may be any type of a hardware design such as an IC. Other examples of the DUT 102 include an application specific IC (ASIC), a processor, memory device, and the like.

The DUT 102 is coupled to a device interface 104 which enables communication (e.g., via electrical signals) with one or more software tools 106. The software tools 106 enable a user to issue commands for verifying the design of the DUT 102. The software tools 106 may interact with a user through a command line or a graphical user interface (GUI). It is also envisioned that the software tools 106 may interact with one or more automated tools (instead of a user) such as other computer programs or media to verify the design of the DUT 102.

The software tools 106 have access to an ESL module 108 to facilitate the verification of the DUT 102. As will be further discussed with reference to FIG. 2, the ESL module 108 assists in compiling and parsing error verification objects which are sent to and received from the DUT 102. The ESL module 108 has access to one or more data storage facilities such as a register interface database 110, a transaction database 112, and a bus interface database 114. The databases 110-114 may be stored on a same device or remotely. For example, different teams may work each of these databases at different locations. In such an embodiment, the ESL module 108 may access these different databases to provide a central location for provision of error scripting solutions.

The register interface database 110 includes a list of all registers corresponding to the DUT 102 and their values. The ESL module 108 may read, write, or monitor these register values. The transaction database 112 includes data regarding transaction types which are utilized in each object communicated in the system 100. In one embodiment, the objects are data packets. Accordingly, data looked up from the transaction database 112 may be utilized to build these packets/objects. The bus interface database 114 includes data regarding signal wires or paths present in the DUT 102. The bus interface database 114 may map logical bus interface information to the actual hardware implementation and vice versa. Accordingly, the ESL module 108 may lookup register, transaction, and/or bus information to build an object which is then communicated to the software tools 106. Alternatively, it is envisioned that the software tools 106 may directly communicate with the databases 110-114 (not shown).

Verification System Operation

Figure 2:
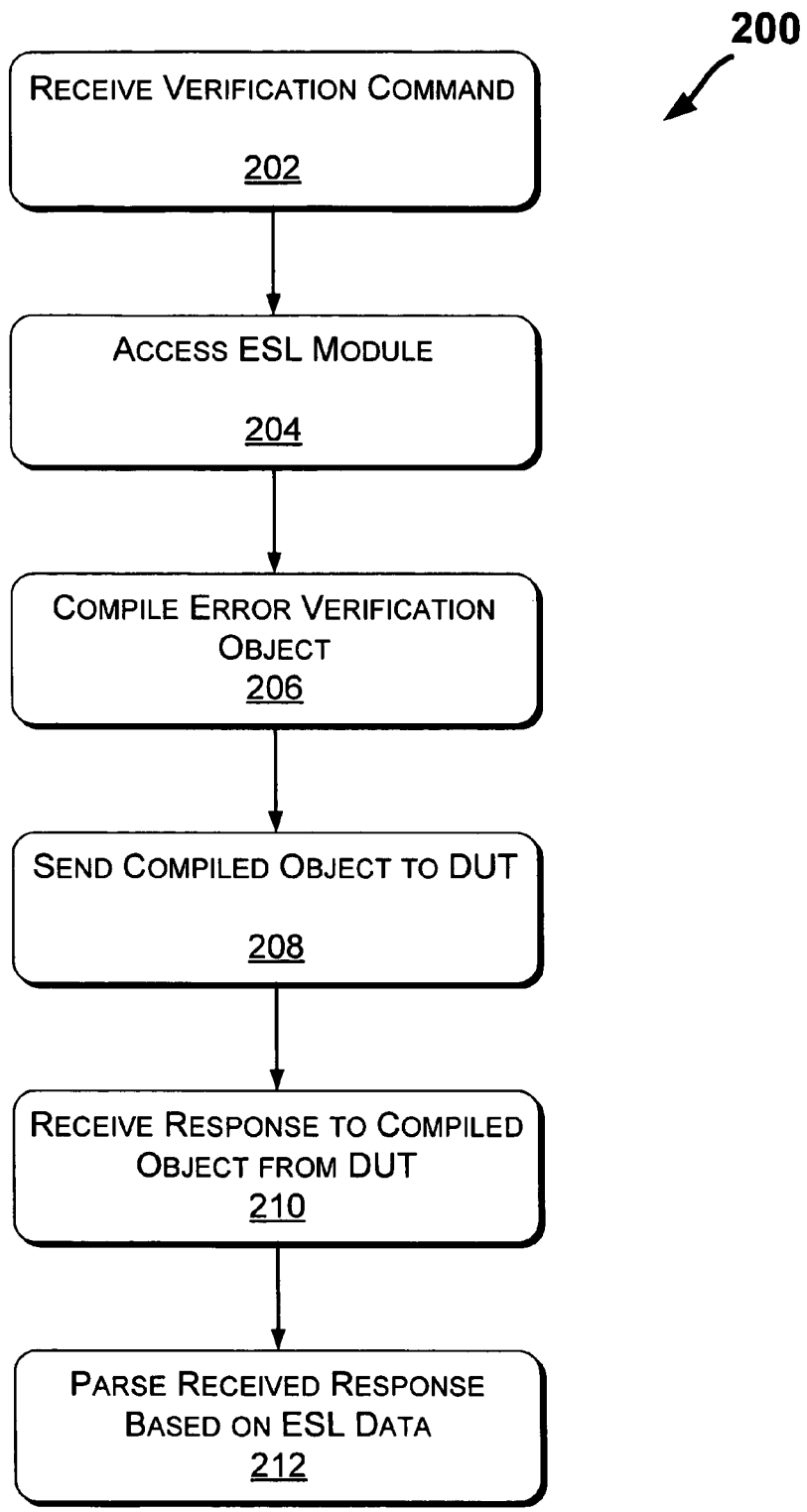
FIG. 2 illustrates an exemplary method of verifying a hardware design which utilizes error scripting, according to an embodiment.

FIG. 2 illustrates an exemplary method 200 of verifying a hardware design which utilizes error scripting. In one embodiment, the method 200 is performed by the verification system 100 of FIG. 1. After receiving a verification command (202) to verify a portion of a hardware design (such as the DUT 102 of FIG. 1), an ESL module (e.g., 108 of FIG. 1) is accessed to obtain hardware-specific data regarding the hardware design. Next, an error verification object is compiled (206). As stated before, the object may be implemented as a data packet. The verification command may be received from a user, e.g., through the software tools 106 of FIG. 1. Also, the verification command may be provided in accordance with syntax of an error scripting language as will be further discussed below. The error verification object is compiled by an ESL module (e.g., 108 of FIG. 1) in an embodiment.

The compiled object is sent to the device under test (208). After the device under test (DUT) responds (210), the response from the DUT is parsed based on data obtained from an ESL module (e.g., 108 of FIG. 1). It is envisioned that the same or different ESL modules may be utilized in the stages 204 and 212. Furthermore, the hardware-specific data may be stored in one or more storage units, and these storage units may be remote from each other. Moreover, each of the storage units may include at least one database (e.g., databases 110-114 of FIG. 1).

The parsed response of the stage 212 may be directly provided to a user (e.g., the same user who issues the verification command of the stage 202). Alternatively, the interaction may be with one or more automated tools (instead of a user) such as other computer programs or computer-readable media, e.g., in an effort to verify the design of the DUT (e.g., 102 of FIG. 1). In an embodiment, the parsed response is verified for correctness and/or matched against an expected response, if one is provided. Failure in either of these cases may result in an error (which may be logged and/or reported back to the user).

Exemplary Error Scripting Module

Figure 3:
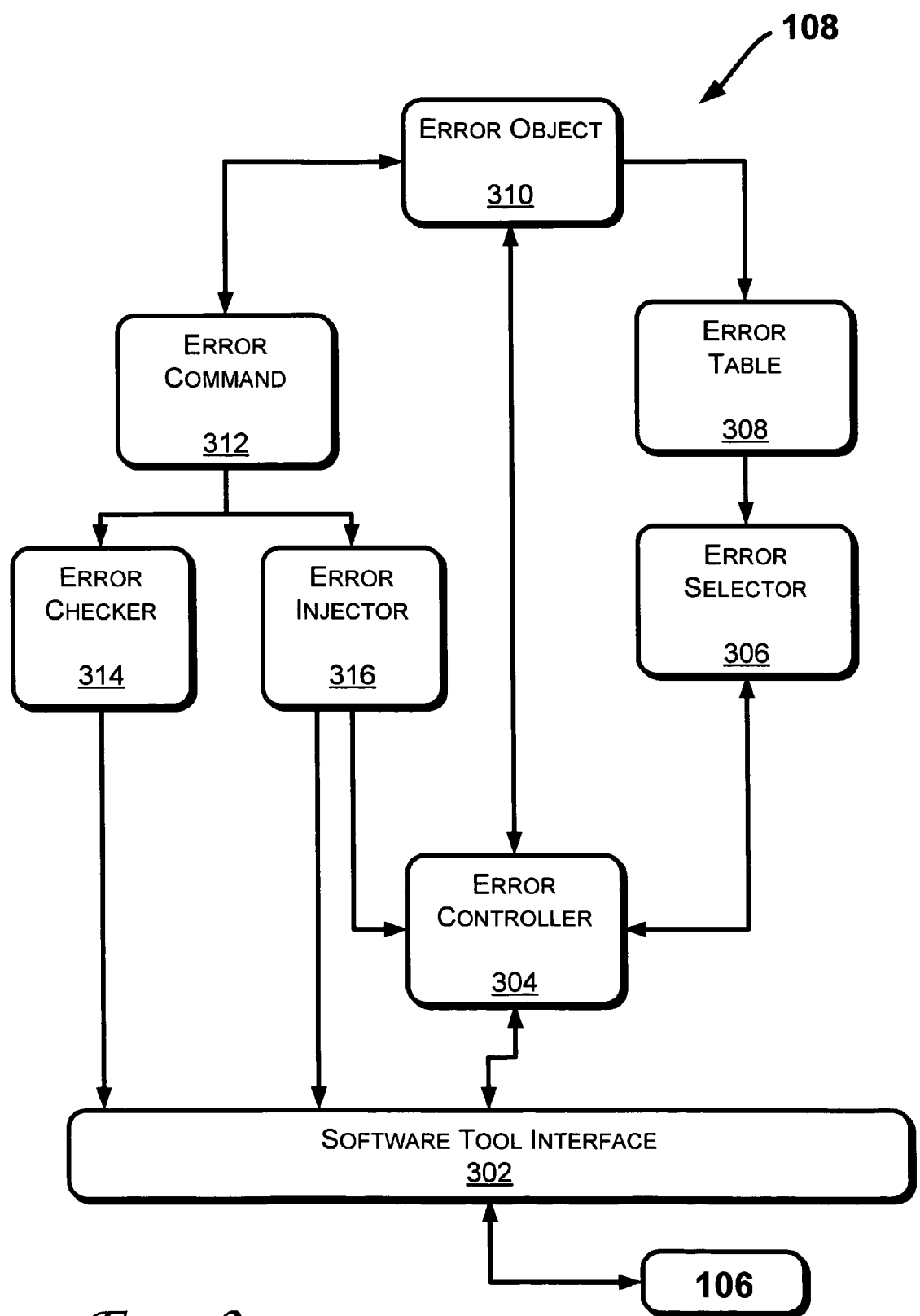
FIG. 3 illustrates exemplary modules within an error scripting module such as the ESL module 108 of FIG. 1, according to an embodiment.

FIG. 3 illustrates exemplary modules within an error scripting module such as the ESL module 108 of FIG. 1. In one embodiment, the direction of arrows shown in FIG. 3 indicates the direction of data flow between the modules of FIG. 3. A software tool interface 302 interacts with the device under test (e.g., 102 of FIG. 1), for example, through the software tools (106) and hardware interface (104) as discussed with reference to FIGS. 1 and 2. An error scripting language (ESL) may specify one or more application programming interfaces (APIs) with which the software tool (302) interfaces. It is also envisioned that the software tool interface (302) may include one or more modules for select tasks such as control status register (CSR) access, system check, system test generation, and the like.

An error controller 304 interfaces with the software tool interface 302 to control the interaction of the various error components as will be further discussed herein. An error selector 306 is coupled to the error controller 304 to query data from an error table (308) and use the query to determine, e.g., based on the user/software inputs, which ESL scripts to run. The error selector 306 selects an ESL script based on one or more items such as hardware block, error category, ESL name, and/or random selection. The error table 308 may be implemented as a buffer which stores data regarding error objects (310).

The error object module 310 may be implemented as a buffer which stores data regarding error to-do lists. In an embodiment, there is one unique error object for every ESL script. An error command module (312) contains information about the individual ESL command. The information stored in this module (312) may determine what the given ESL command will do to the hardware. An error checker 314 is coupled to the error command module 312 to observe the device under test for a specific action and provide an indication of success or failure with regards to that expected specific action.

An error injector module 316 is also coupled to the error command module 312 to inject the specific action on the device under test (DUT), e.g., via the software tool interface 302. The error injector module 316 receives its input from the error command module 312. The error injector module 316 may interact with the register interface (110), transaction (112), and/or bus interface (114) databases. Accordingly, various modules illustrated in FIG. 3 may be utilized to compile and/or parse data objects (or packets) that are transferred to and from the device under test, e.g., via the software tools (106) of FIG. 1. This is envisioned to enable a user (or an automated program) to verify the design of the DUT through the error scripting language, instead of through reprogramming and recompiling toolsets for every change made to verification tests.

Error Scripting Language (ESL)

A hardware and tool-independent error scripting language (ESL) may be utilized to assist in verifying a portion of a hardware design (such as discussed with reference to FIGS. 1-3). The ESL is tool-independent, in part, because no specific references are presented to any software tool or its component. As such, the test writer does not need to worry about the details of the design verification tools (such as the software tools 106 discussed with reference to FIG. 1), which are interfacing with the ESL script. The same ESL script may be executed transparently across multiple design verification tool environments.

Mapping commands to software tools (and ESL components) may be left to the modules that process the language (such as those discussed with reference to FIG. 3), not the language itself. Hence, for different tools which are testing the same hardware, the tests written in this language may be executed on the different tools, without having to recompile the tools.

The ESL is capable of setting up, injecting, checking, and recovering system-level errors in an embodiment. The ESL may also support program constructs and mathematical logic operations such as AND, OR, Right Shifts and Left Shifts. More particularly, the ESL language may support one or more of the following packet, control status register (CSR), bus, helper, miscellaneous, and conditional commands in various embodiments, e.g., to access the data (stored in databases 110-114 of FIG. 1) provided through the ESL module (108 of FIG. 1):

Packet Commands
  InsertPkt ( . . . ) [Injects the packet described in the expression. InsertPkt is a blocking command—it will end the current step and all previous commands need to complete before going to the next step. The next ESL command will be forced into a new step, therefore one insertPkt is possible in a single step. In an embodiment, a step is generally a unit in which ESL commands can be executed. Some ESL commands like InsertPkt may be the only ESL command in that step, while some multiple ESL commands such as the ExpectPkt, ExpectCsr (discussed below) may be executed in a single step. Also, the ESL parser may put the various ESL commands in different steps.]
  CorruptPkt ( . . . ) [Corrupt random bits in a packet.]
  ExpectPkt ( . . . ) [Expect a result, optionally within a specified period]
  Respond ( . . . ) [Respond to a received packet by injecting a defined packet.]
  Release ( . . . )[Release the specified system resources when an expected value has been reached, otherwise log an error.]
CSR Commands
  WriteCSR ( . . . ) [Write to the specified CSR.]
  ExpectCSR ( . . . ) [Check/monitor the specified CSR.]
  ReadCSR ( . . . ) [Read from the specified CSR.]
BUS Commands
  DriveBus ( . . . ) [Write to the specified bus.]
  ExpectBus ( . . . ) [Check the specified bus.]
  CorruptBus ( . . . ) [Corrupt the specified data on the bus, e.g., number of bits for a duration.]
Helper Functions
  Address ( . . . ) [Define addresses to be accessed.]
  Packet ( . . . ) [Define packet types.]
  Pickcell ( . . . ) [Randomly pick a cell which matches the specified address types.]
  GetInstance ( . . . ) [Returns an instance of an IC or a block within an IC.]
  Stop_traffic ( . . . ) [Stops traffic to a given subsection of the DUT.]
  Start_traffic ( . . . ) [Starts traffic to a given subsection of the DUT.]
Miscellaneous Commands
  Delay ( . . . ) [Wait the specified number of clock cycles before continuing.]
  Newstep [Ends the current step. Any following commands will be placed in a new step.]
  SetSeed ( . . . ) [Sets the random number generator to a specific seed value for use in selecting random values in the ESL corrupt commands.]
  SetPacketDb ( . . . ) [Sets the database used to generate field names for ESL bus commands.]
Conditional Commands
  if (expression)
  else
  else if (expression)

For the conditional commands, expressions may include Boolean operators, comparison operators, and/or bitwise operators.

Exemplary Computing Environment

Figure 4:
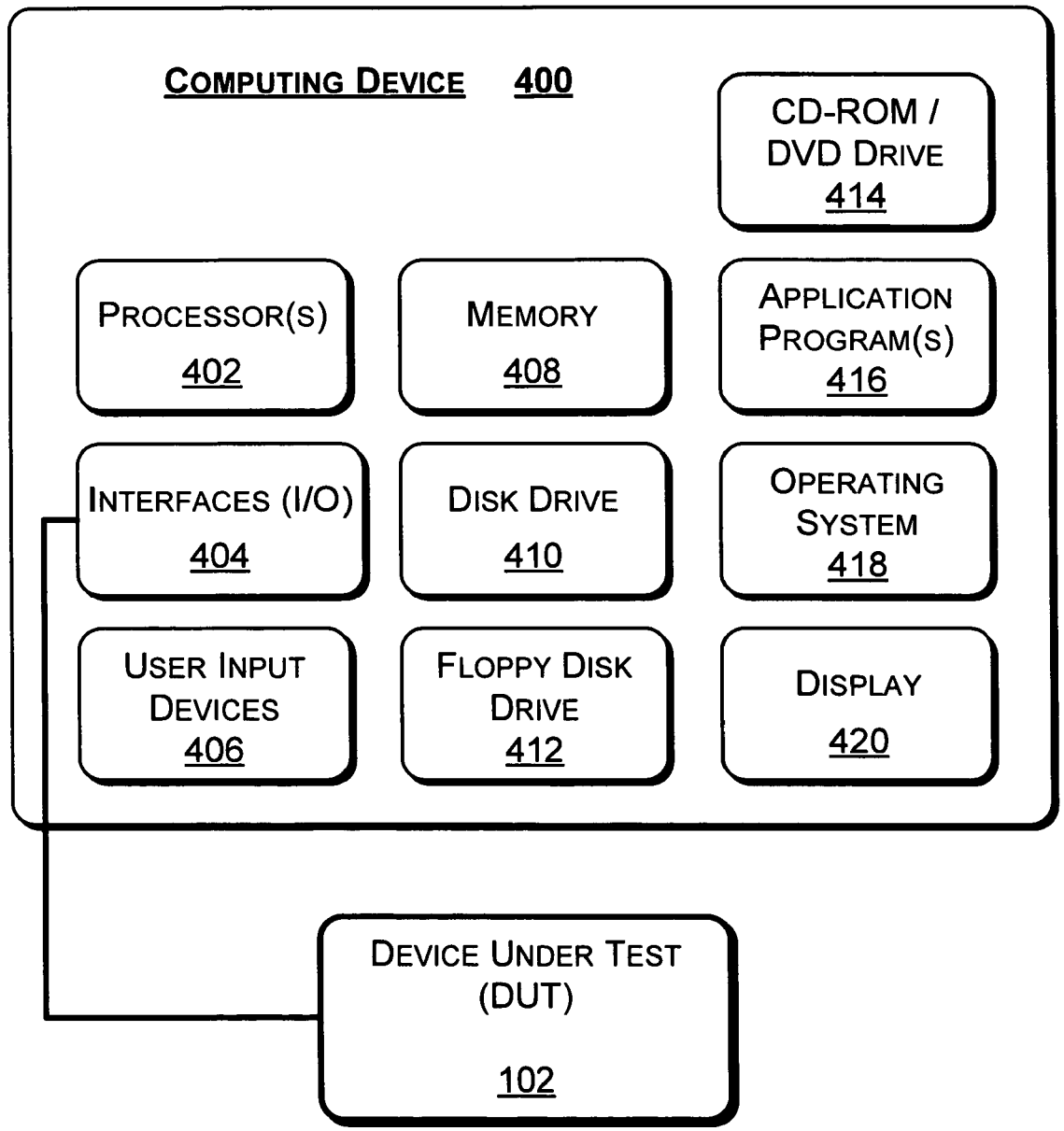
FIG. 4 illustrates various components of an exemplary computing device 400 which may be utilized to implement portions of the hardware verification techniques discussed herein, according to an embodiment.

FIG. 4 illustrates various components of an exemplary computing device 400 which may be utilized to implement portions of the hardware verification techniques discussed with reference to FIGS. 1-3. In one embodiment, the computing device 400 can be used to access the databases 110-114 of FIG. 1 and/or implement other portions of the system 100 such as the software tools 106 and/or ESL module 108.

The computing device 400 includes one or more processor(s) 402 (e.g., microprocessors, controllers, etc.), input/output interfaces 404 for the input and/or output of data, and user input devices 406. The processor(s) 402 process various instructions to control the operation of the computing device 400, while the input/output interfaces 404 provide a mechanism for the computing device 400 to communicate with other electronic and computing devices. The user input devices 406 can include a keyboard, mouse, pointing device, and/or other mechanisms to interact with, and to input information to the computing device 400.

The input/output interfaces 404 can include serial, parallel, and/or network interfaces. As illustrated in FIG. 4, the input/output interfaces 404 may be communicated with the DUT 102 in one embodiment. A network interface allows devices coupled to a common data communication network to communicate information with the computing device 400. Similarly, a communication interface, such as a serial and/or parallel interface, a universal serial bus (USB) interface, an Ethernet interface, an Institute of Electrical & Electronics Engineers (IEEE) 802.11 interface, and/or any combination of wireless or wired communication interfaces provides a data communication path directly between the computing device 400 and another electronic or computing device.

The computing device 400 also includes a memory 408 (such as read-only memory (ROM) and/or random-access memory (RAM)), a disk drive 410, a floppy disk drive 412, and a compact disk read-only memory (CD-ROM) and/or digital video disk (DVD) drive 414, all of which provide data storage mechanisms for the computing device 400. Any number and combination of memory and storage devices can be connected with, or implemented within, the computing device 400. Although not shown, a system bus typically connects the various components within the computing device 400.

The computing device 400 also includes one or more application program(s) 416 and an operating system 418 which can be stored in non-volatile memory (e.g., the memory 408) and executed on the processor(s) 402 to provide a runtime environment in which the application programs 416 can run or execute. The computing device 400 can also include an integrated display device 420, such as for a PDA, a portable computing device, and any other mobile computing device.

Select embodiments discussed herein (such as those discussed with reference to FIGS. 1-3) may include various operations. These operations may be performed by hardware components or may be embodied in machine-executable instructions, which may be in turn utilized to cause a general-purpose or special-purpose processor, or logic circuits programmed with the instructions to perform the operations.

Alternatively, the operations may be performed by a combination of hardware and software.

Moreover, some embodiments may be provided as computer program products, which may include machine-readable or computer-readable medium having stored thereon instructions used to program a computer (or other electronic devices) to perform a process discussed herein. The machine-readable medium may include, but is not limited to, floppy diskettes, hard disk, optical disks, CD-ROMs, and magneto-optical disks, ROMs, RAMs, erasable programmable ROMs (EPROMs), electrically EPROMs (EEPROMs), magnetic or optical cards, flash memory, or other types of media or machine-readable medium suitable for storing electronic instructions and/or data. Moreover, data discussed herein may be stored in a single database, multiple databases, or otherwise in select forms (such as in a table).

Additionally, some embodiments discussed herein may be downloaded as a computer program product, wherein the program may be transferred from a remote computer (e.g., a server) to a requesting computer (e.g., a client) by way of data signals embodied in a carrier wave or other propagation medium via a communication link (e.g., a modem or network connection).

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment.

Thus, although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. A method comprising:
   compiling an error verification object corresponding to an error verification command to verify a portion of a hardware design of a device under test, the error verification object being compiled in accordance with data provided by an error scripting module, the error scripting module having access to hardware-specific data corresponding to the hardware design of the device under test;
   sending the compiled error verification object to the device under test;
   receiving a response to the compiled error verification object from the device under test; and
   parsing the received response from the device under test in accordance with data provided by the error scripting module.

2. The method of claim 1, wherein the received response indicates whether the portion of the hardware design is successfully verified.

3. The method of claim 1, wherein the error verification object is implemented as a data packet.

4. The method of claim 1, wherein the error verification command is received from a user.

5. The method of claim 1, wherein the error verification command is received from a user through a software tool, wherein the software tool is in electrical communication with the device under test.

6. The method of claim 1, wherein the error verification command is received from a user through a software tool, wherein the software tool is in electrical communication with the device under test through a hardware interface.

7. The method of claim 1, wherein the hardware-specific data is stored in one or more storage units.

8. The method of claim 1, wherein the hardware-specific data is stored in one or more remote storage units.

9. The method of claim 1, wherein the hardware-specific data is stored in one or more storage units, each of the storage units comprising at least one database.

10. The method of claim 1, wherein the error verification command is provided in accordance with syntax of an error scripting language.

11. The method of claim 1, wherein the error verification command is provided in accordance with syntax of an error scripting language (ESL) and there is no reference to specific software tools within the ESL syntax.

12. The method of claim 1, wherein the device under test is an integrated circuit.

13. The method of claim 1, wherein the error scripting module comprises one or more items selected from a group comprising an error controller, an error selector, an error table, an error object, an error to-do, an error checker, and an error injector.

14. A system comprising:
   a software tool to receive an error verification command;
   an error scripting language module coupled to the software tool and configured to compile an error verification object corresponding to the error verification command to verify a portion of a hardware design of a device under test, the error verification object being compiled in accordance with data provided by an error scripting module, the error scripting module having access to hardware-specific data corresponding to the hardware design of the device under test,
   wherein the compiled error verification object is sent to the device under test and a response to the compiled error verification object is parsed by the error scripting language module to determine whether the portion of the hardware design is successfully verified; and
   a storage device to store the hardware-specific data.

15. The system of claim 14, wherein the error verification object is implemented as a data packet.

16. The system of claim 14, wherein the error verification command is received from a user through the software tool, wherein the software tool is in electrical communication with the device under test.

17. The system of claim 14, wherein the error verification command is received from a user through the software tool, wherein the software tool is in electrical communication with the device under test through a hardware interface.

18. The system of claim 14, wherein the hardware-specific data is stored in one or more storage units.

19. The system of claim 14, wherein the hardware-specific data is stored in one or more remote storage units.

20. The system of claim 14, wherein the hardware-specific data is stored in one or more storage units, each of the storage units comprising at least one database.

21. The system of claim 14, wherein the error verification command is provided in accordance with syntax of an error scripting language.

22. The system of claim 14, wherein the error verification command is provided in accordance with syntax of an error scripting language (ESL) and there is no reference to specific software tools within the ESL syntax.

23. The system of claim 14, wherein the device under test is an integrated circuit.

24. The system of claim 14, wherein the error scripting module comprises one or more items selected from a group comprising an error controller, an error selector, an error table, an error object, an error to-do, an error checker, and an error injector.

25. One or more computer-readable media having instructions stored thereon that, when executed, direct a machine to perform acts comprising:
- compiling an error verification object corresponding to an error verification command to verify a portion of a hardware design of a device under test, the error verification object being compiled in accordance with data provided by an error scripting module, the error scripting module having access to hardware-specific data corresponding to the hardware design of the device under test;
- sending the compiled error verification object to the device under test;
- receiving a response to the compiled error verification object from the device under test; and
- parsing the received response from the device under test in accordance with data provided by the error scripting module.

26. The computer-readable media of claim 25, wherein the received response indicates whether the portion of the hardware design is successfully verified.

27. The computer-readable media of claim 25, wherein the error verification command is received from a user through a software tool, wherein the software tool is in electrical communication with the device under test.

28. The computer-readable media of claim 25, wherein the error verification command is received from a user through a software tool, wherein the software tool is in electrical communication with the device under test through a hardware interface.

29. The computer-readable media of claim 25, wherein the hardware-specific data is stored in one or more storage units.

30. The computer-readable media of claim 25, wherein the error verification command is provided in accordance with syntax of an error scripting language (ESL) and there is no reference to specific software tools within the ESL syntax.

31. The computer-readable media of claim 25, wherein the device under test is an integrated circuit.

32. The computer-readable media of claim 25, wherein the error scripting module comprises one or more items selected from a group comprising an error controller, an error selector, an error table, an error object, an error to-do, an error checker, and an error injector.

33. An apparatus comprising:
- means for compiling an error verification object corresponding to an error verification command for verifying a portion of a hardware design of a device under test;
- means for communicating with the device under test;
- means for parsing a received response from the device under test in accordance with data provided by an error scripting module; and means for storing data corresponding to the hardware design.

34. The apparatus of claim 33, further comprising means for storing data.

* * * * *

UNITED STATES PATENT AND TRADEMARK OFFICE
CERTIFICATE OF CORRECTION

PATENT NO. : 7,447,966 B2 Page 1 of 1
APPLICATION NO. : 11/030349
DATED : November 4, 2008
INVENTOR(S) : Anand V. Kamannavar et al.

It is certified that error appears in the above-identified patent and that said Letters Patent is hereby corrected as shown below:

On the Title Page Item (73), in "Assignee", line 2, after "Company," insert -- L.P., --.

Signed and Sealed this

Twenty-sixth Day of May, 2009

JOHN DOLL
*Acting Director of the United States Patent and Trademark Office*